United States Patent
Kobayashi et al.

(10) Patent No.: US 6,440,774 B2
(45) Date of Patent: Aug. 27, 2002

(54) ELECTRONIC DEVICE, METHOD OF MANUFACTURING THE SAME, AND APPARATUS FOR MANUFACTURING THE SAME

(75) Inventors: Takeshi Kobayashi; Takashi Araki, both of Tochigi (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 0 days.

(21) Appl. No.: 09/845,568

(22) Filed: Apr. 30, 2001

Related U.S. Application Data (62) Division of application No. 09/578,438, filed on May 25, 2000, now Pat. No. 6,350,631.

(30) Foreign Application Priority Data

| May 27, 1999 | (JP) | 11-147956 |
| Sep. 6, 1999 | (JP) | 11-251149 |
| May 11, 2000 | (JP) | 2000-139072 |

(51) Int. Cl.⁷ .............................................. H01L 21/44
(52) U.S. Cl. ................... 438/107; 438/101; 438/110; 156/89; 174/52.1; 174/52.4
(58) Field of Search ............................... 438/107, 101, 438/110; 174/52.1, 52.4; 156/89

(56) References Cited

U.S. PATENT DOCUMENTS

| 3,483,308 A | 12/1969 | Wakely | 174/52.1 |
| 4,525,597 A * | 6/1985 | Abe | 174/52 |
| 5,277,723 A | 1/1994 | Kodama et al. | 156/89.15 |
| 5,950,304 A * | 9/1999 | Khandros et al. | 29/831 |
| 6,002,592 A * | 12/1999 | Nakamura et al. | 361/760 |
| 6,142,096 A * | 11/2000 | Sakai et al. | 118/723 |

FOREIGN PATENT DOCUMENTS

| JP | 8-078732 A | 3/1996 |
| JP | 10-313082 | 11/1998 |
| JP | 11-176856 A | 7/1999 |
| JP | 11-265964 A | 9/1999 |

* cited by examiner

Primary Examiner—Vu A. Le
Assistant Examiner—Pho M. Luu
(74) Attorney, Agent, or Firm—Merchant & Gould PC (57) ABSTRACT

An electronic device such as a semiconductor device, a method of manufacturing the same, and an apparatus for manufacturing the same, wherein by placing a ceramic substrate provided with a metallic thin film integrated into at least one selected from an upper surface and a lower surface of the ceramic substrate in its peripheral portion so as to extend both inside and outside a cavity of a mold for transfer molding, and positioning the metallic thin film in a position with which an upper mold and a lower mold of the mold come into contact, occurrence of cracks or breakage in the ceramic substrate is prevented by buffering the pressure applied to the ceramic substrate so as to prevent a distortion force from being caused even when the ceramic substrate is sandwiched and compressed between the upper mold and the lower mold.

16 Claims, 10 Drawing Sheets

ELECTRONIC DEVICE, METHOD OF MANUFACTURING THE SAME, AND APPARATUS FOR MANUFACTURING THE SAME

This application is a divisional of application Ser. No. 09/578,438, filed May 25, 2000, now U.S. Pat. No. 6,350,631.

FIELD OF THE INVENTION

The present invention relates to an electronic device, a method of manufacturing the same, and an apparatus for manufacturing the same. The present invention relates to an electronic device of a semiconductor device such as, for example, a leadless small surface mount transistor or diode, a method of manufacturing the same, and an apparatus for manufacturing the same.

BACKGROUND OF THE INVENTION

Figure 9A:
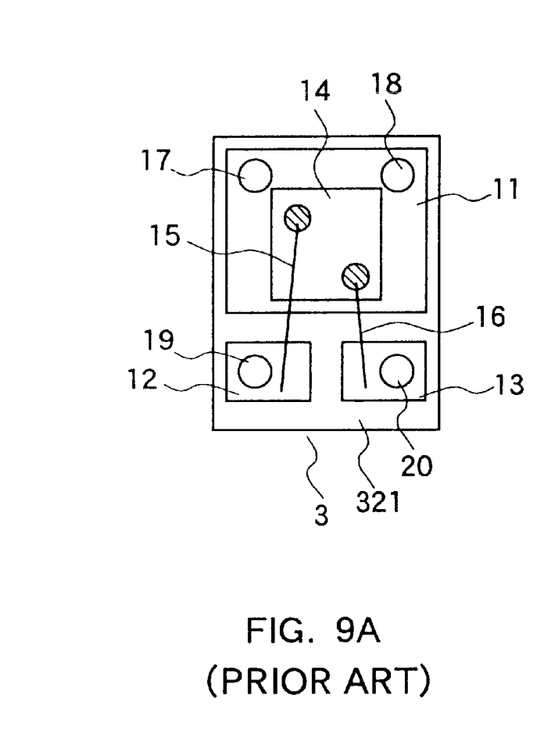
FIG. 9A is its plan view.
Figure 9B:
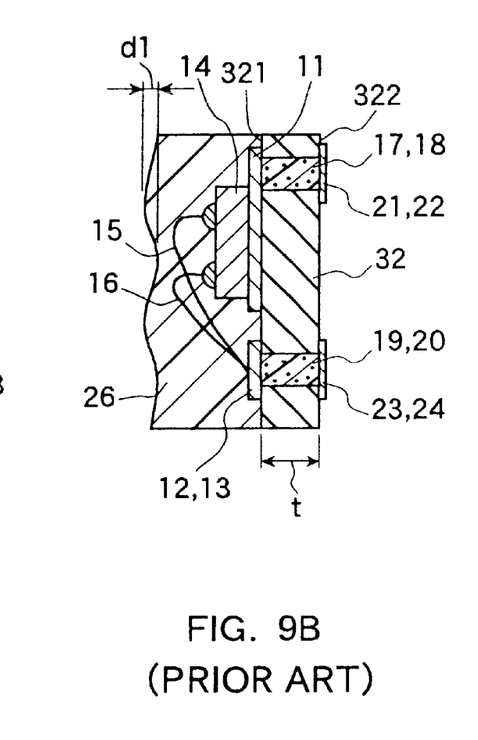
FIG. 9B is its sectional side view.
Figure 9C:
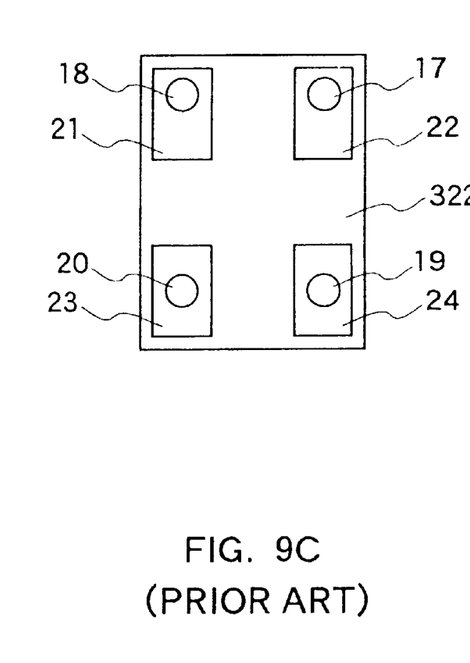
FIG. 9C is its bottom view.

FIGS. 9A to 9C show a structural example of a conventional leadless small surface mount transistor: FIG. 9A is its plan view; FIG. 9B is its sectional side view; and FIG. 9C is its bottom view.

As shown in FIGS. 9A and 9B, a leadless small surface mount electronic device 3 includes: a first upper electrode 11 provided with an element mount portion on an upper surface 321 of a ceramic substrate 32; and a second upper electrode 12 and a third upper electrode 13 that are positioned so as to be separated from the first upper electrode 11.

On the back surface of a semiconductor chip on which a transistor 14 is formed, for instance, a collector electrode is formed by metal deposition or the like. The collector electrode of the transistor 14 is fixed to the first upper electrode 11 by die bonding or the like and thus the first upper electrode 11 is electrically connected to the collector electrode of the transistor 14.

The second upper electrode 12 and for example, a base electrode of the transistor 14 are connected with a metal wire 15. Similarly, the third upper electrode 13 and for example, an emitter electrode of the transistor 14 are connected with a metal wire 16. A pair of lower electrodes 21 and 22 electrically connected to the first upper electrode 11 are formed on a lower surface 322 of the ceramic substrate 32. The first upper electrode 11 and the pair of lower electrodes 21 and 22 are electrically connected through conductive relay members going through the ceramic substrate 32, i.e. via holes 17 and 18.

Similarly, on the lower surface 322 of the ceramic substrate 32, lower electrodes 23 and 24 are formed, which are electrically connected to the second upper electrode 12 and the third upper electrode 13 through via holes 19 and 20 going through the ceramic substrate 32, respectively.

As shown in FIG. 9C, the lower electrodes 21, 22, 23, and 24 are positioned at the four corners of the lower surface 322 of the ceramic substrate 32.

These lower electrodes 21 to 24 are attached, for example, to a wiring pattern provided in a printed circuit board, which is not shown in the figure, with a conductive adhesive such as solder or the like.

Figure 10A:
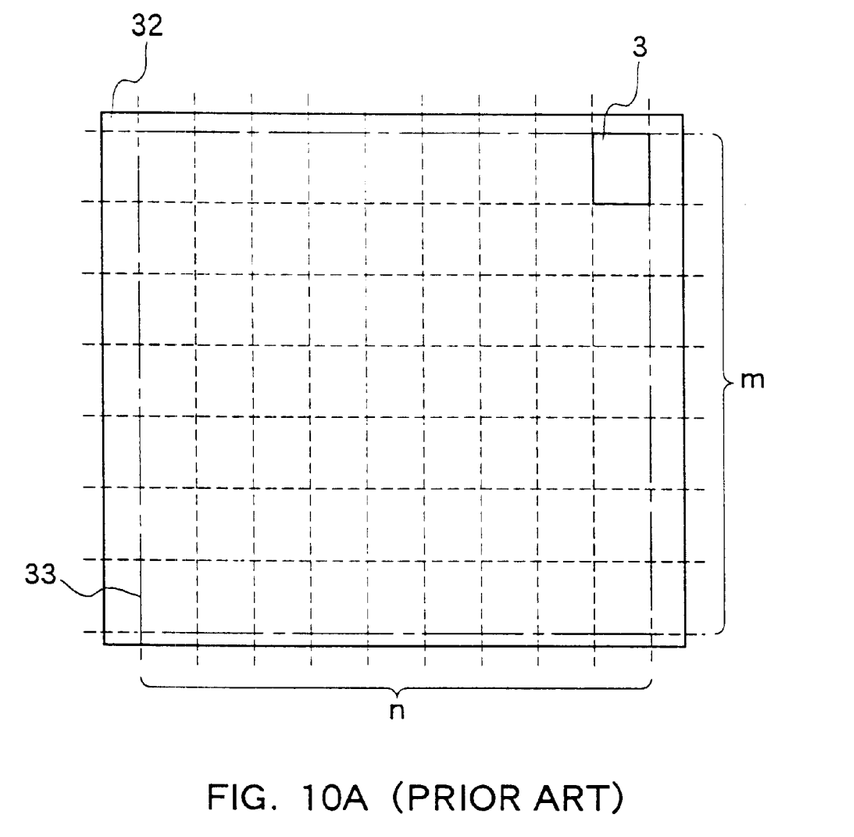
FIG. 10A is its plan view.
Figure 10B:
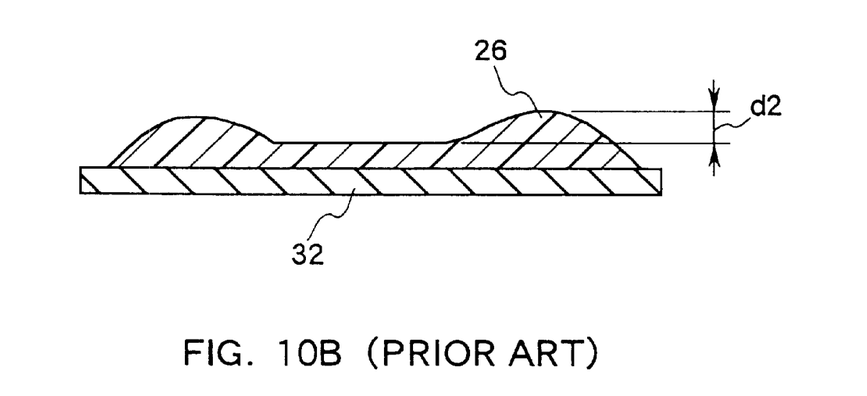
FIG. 10B is its sectional side view.

FIGS. 10A and 10B show a so-called master electronic device in which a plurality of individual electronic devices are formed, which is divided into individual electronic devices as shown in FIGS. 9A to 9C later. In other words, as shown in FIG. 10A, m×n pieces of electronic devices 3 are formed on one common ceramic substrate 32 in a matrix form. In the respective electronic devices 3, electronic elements such as a transistor, a diode, a resistor, and the like already have been mounted on a wiring pattern (electrode) formed on the ceramic substrate 32. In addition, predetermined electrodes of the electronic elements, for example, a collector electrode, a base electrode, and an emitter electrode of the transistor are connected to the wiring pattern (electrode) provided on the ceramic substrate directly or via metal wires or the like.

After that, as shown in FIG. 10B, generally the upper surface of the electrode ceramic substrate 32 is coated with liquid resin 26 by a potting method, a dispenser method, a vacuum printing method, or the like. The liquid resin 26 is cured by heating, and thus the upper surface is sealed with the resin. Then, the master electronic device is divided into individual electronic devices along cutting plane lines 33 (FIG. 10A) by a dicing saw.

Generally, the conventional leadless small surface mount electronic device is obtained by allowing liquid resin to form a resin package by the potting method, the dispenser method, the vacuum printing method, or the like and then curing the resin in a curing oven or the like. However, the material obtained by curing the liquid resin has a glass transition point of about 100° C., which is low. Therefore, when solder reflow is carried out at 230° C., the resin that has been cured is resoftened and therefore the resin thus softened is peeled off from the ceramic substrate easily, which has been a problem.

Furthermore, in the potting method and the dispenser method, the liquid resin merely is dropped or poured onto the ceramic substrate and then is cured without being molded under pressure, thus forming a resin package. Therefore, there have been the following problems. As shown in FIG. 9B, not only unevenness d1 in thickness of the resin that has been cured is caused but also it is difficult to increase the density of the resin. Thus, the strength of the resin is low, and when subjected to an external stress, the resin package is deformed easily.

Similarly, in the vacuum printing method, liquid resin simply is applied onto the ceramic substrate using a printing means and then is cured. Therefore, there has been a problem that an unevenness d1 in thickness of about 5 to 15 μm occurs in the resin that has been cured.

As described above, in the conventional formation methods, not only has the difference in thickness of the resin in an electronic device been caused to increase an irregularity of its surface, but also between electronic devices the difference in thickness of the resin has been caused. Therefore, there has been a problem that after the formation by resin sealing, after-processing such as grinding of the resin surface using a grindstone or the like must be carried out.

As shown in FIG. 10B, when using the liquid resin, the thickness of the resin increases in the peripheral portion of the ceramic substrate and is uniform only in the vicinity of the center of the substrate. The difference d2 in thickness of the resin between the vicinity of the center and the peripheral portion of the ceramic substrate reaches about 0.1 mm.

Furthermore, there have been the following problems. In a dicing step for forming individual packages, it is difficult to allow the resin surface of the electronic device to adhere to a fixing tape or the like due to the irregularities d1 and d2 on the surface of the electronic device after the resin is cured. In addition, the individual electronic devices cut in dicing come off from the fixing tape and thus are lost easily.

In the resin sealing by a transfer molding method using a mold, which has been known conventionally as a method of sealing a semiconductor, the ceramic substrate is not easily bent compared to other resin substrates or metal lead frames. Therefore, due to the distortion caused by pressure applied when the ceramic substrate is sandwiched between upper and lower molds, cracks or breakage occur easily in the ceramic substrate. Consequently, the resin sealing by the transfer molding method was not employed for the conventional leadless small surface mount transistor.

SUMMARY OF THE INVENTION

In order to solve the aforementioned conventional problems, the present invention is intended to provide an electronic device, a method of manufacturing the same, and an apparatus for manufacturing the same, wherein the occurrence of cracks or breakage in a ceramic substrate can be prevented by buffering the pressure applied to the ceramic substrate so as to prevent a distortion force from being caused even when the ceramic substrate is sandwiched and compressed between upper and lower molds.

In order to achieve the above-mentioned object, an electronic device of the present invention is obtained by mounting plural sets of electronic components on a ceramic substrate and sealing the electronic components with thermosetting resin by transfer molding. The electronic device is provided with a metallic thin film integrated into at least one selected from an upper surface and a lower surface of the ceramic substrate at its peripheral portion.

As the metallic thin film, upper electrodes provided on the ceramic substrate also can be used. That is to say, the metallic thin film includes one utilizing electrodes.

A method of manufacturing an electronic device according to the present invention includes: mounting plural sets of electronic components on a ceramic substrate; and sealing the electronic components with thermosetting resin by transfer molding. In the method, the ceramic substrate provided with a metallic thin film integrated into at least one selected from an upper surface and a lower surface of the ceramic substrate in its peripheral portion is placed so as to extend both inside and outside a cavity of a mold for transfer molding and the metallic thin film is positioned in a portion with which an upper mold and a lower mold of the mold come into contact, and the thermosetting resin for transfer molding is injected into the cavity, is molded, and then is cured by heating.

An apparatus for manufacturing an electronic device according to the present invention includes: a plunger for pressurizing thermosetting resin for transfer molding; a runner in which the thermosetting resin for transfer molding flows; a cavity into which the thermosetting resin for transfer molding flows, which communicates with the runner; and a mold for transfer molding including an upper mold and a lower mold that define the cavity. In the apparatus, a ceramic substrate provided with a metallic thin film integrated into at least one selected from an upper surface and a lower surface of the ceramic substrate in its peripheral portion is placed so as to extend both inside and outside the cavity of the mold for transfer molding, and the metallic thin film is positioned in a portion with which the upper mold and the lower mold of the mold come into contact, and the thermosetting resin for transfer molding is injected into the cavity, is molded, and then is cured by heating.

According to the present invention, the ceramic substrate provided with the metallic thin film integrated into at least one selected from the upper surface and the lower surface of the ceramic substrate in its peripheral portion is placed so as to extend both inside and outside the cavity of the mold for transfer molding, and the metallic thin film is positioned in a portion with which the upper mold and the lower mold of the mold come into contact. Therefore, even when the ceramic substrate is sandwiched and compressed between the upper and lower molds, the pressure applied to the ceramic substrate is buffered. Thus, no distortion force is caused and the occurrence of cracks or breakage in the ceramic substrate can be prevented.

BRIEF DESCRIPTION OF THE DRAWINGS

FIG. 9 shows a conventional electronic device.

FIG. 10 shows a conventional master electronic device in which a plurality of electronic devices are formed.

DETAILED DESCRIPTION OF THE INVENTION

In the electronic device of the present invention, it is preferable that the metallic thin film is present on each of the upper surface and the lower surface of the ceramic substrate, since the pressure applied by both the upper and lower molds of the mold can be buffered.

In the electronic device of the present invention, it is preferable that the metallic thin film is formed by printing a metal paste on a green sheet of a material of the ceramic substrate and sintering it so as to integrate it into the ceramic substrate when the green sheet is sintered, since cost reduction can be achieved. In terms of cost, it is preferable that the same material as that of the electrodes formed on the upper surface and/or the lower surface of the ceramic substrate is used as the metal paste and the metallic thin film is formed in the same step as that for forming the electrodes. For the metallic thin film, for instance, tungsten can be used.

It is preferable that the metallic thin film has a thickness in a range of 10 to 50 μm. In the case where the thickness is in this range, the pressure applied by the mold can be buffered. It is preferable that the metallic thin film has a width in a range of 1.0 to 2.5 mm. In the case where the width is in this range, when the upper and lower molds are set, their peripheries can be brought into contact with the metallic thin film accurately.

As the thermosetting resin, resins well known in the art can be used. For instance, epoxy resin can be used. The epoxy resin is obtained by using well-known bisphenol A or cresol-novolac glycidyl ether resin as a base, mixing an aromatic amine hardener or an acid anhydride hardener and a filler thereto, and allowing it to react to some degree to provide suitable moldability. As the filler, a filler such as silica powder, talc powder, or the like of about 85 wt. % can be added.

The coating thickness of the thermosetting resin varies depending on a standard of a product, but is in a range of 0.35 to 0.6 mm as one example.

The thickness of the ceramic substrate varies depending on a standard of a product, but is in a range of 0.1 to 0.5 mm as one example.

The master electronic device obtained according to the present invention is divided into individual electronic devices by dicing.

In the method of the present invention, it is preferable that conditions in the transfer molding include a temperature in a range between 140 and 190° C., a molding pressure of 10 to 50 kg/cm$^2$, and a curing time of 60 to 100 sec.

It is preferable that a slide member is further provided in a portion, where the ceramic substrate is placed, of at least one of the upper mold and the lower mold, and the slide member is positioned so as to press the ceramic substrate in its thickness direction.

Further, it is preferred to allow a resin film to adhere to a surface for molding resin of at least one of the upper mold and the lower mold, since a buffer effect on the ceramic substrate further increases.

An electronic device according to an example of the present invention includes: an electronic element provided with at lest two electrodes; a ceramic substrate; a first electrode that is provided on one surface of the ceramic substrate and is electrically connected to one of the electrodes of the electronic element; a second electrode electrically connected to the other electrode of the electronic element; a metal wire for connecting the second electrode and the other electrode of the electronic element; a third electrode and a fourth electrode that are provided on the other surface of the ceramic substrate and are electrically connected to the first and second electrodes, respectively; a plurality of conductive relay members that are formed between the one surface and the other surface of the ceramic substrate and electrically connect the first electrode to the third electrode and the second electrode to the fourth electrode; and coating resin for coating the electronic element. The electronic device is coated and sealed with the coating resin of thermosetting resin for transfer molding except for the other surface of the ceramic substrate. According to this configuration, the surface coated with the resin can be improved in flatness and in glass transition point compared to the case of using liquid resin. Consequently, the resin that has been cured is not resoftened at high temperatures in solder reflow, thus solving the problems of peeling off of the resin from the ceramic substrate, deformation of a resin package due to an external force, or the like by increasing the density of the resin.

An electronic device according to another example of the present invention includes: an electronic element provided with at least two electrodes; a circuit unit including a plurality of the electronic elements; a ceramic substrate; a first electrode that is provided on one surface of the ceramic substrate and is connected to a predetermined electrode of the circuit unit; a second electrode connected to another predetermined electrode of the circuit unit; a metal wire for connecting the second electrode and the another predetermined electrode of the circuit unit; a third electrode and a fourth electrode that are provided on the other surface of the ceramic substrate and are connected to the first and the second electrodes, respectively; a plurality of conductive relay members that are formed between the one surface and the other surface of the ceramic substrate and connect the first electrode to the third electrode and the second electrode to the fourth electrode; and coating resin for coating the circuit unit. The electronic device is coated with the coating resin of thermosetting resin for transfer molding except for the other surface of the ceramic substrate. According to this example, the same effect as that mentioned above can be obtained.

An electronic device according to still another example of the present invention is obtained by: positioning circuit units including at least one or a plurality of the electronic elements, on one common ceramic substrate in a matrix form; coating the electronic elements or the circuit units with coating resin, and dividing it throughout from the coating resin to the ceramic substrate so that the electronic elements or the circuit units are separated from one another to have a substantially rectangular solid shape. According to this example, the resin surface can be fixed to a fixing tape securely in dicing and therefore individual electronic devices do not come off from the fixing tape to be lost.

Furthermore, in an electronic device of still another example according to the present invention, an electronic element having at least two electrodes is positioned on one surface of a ceramic substrate, a first electrode to be electrically connected to one of the two electrodes of the electronic element and a second electrode to be electrically connected to the other of the two electrodes of the electronic element are formed on the one surface of the ceramic substrate, the other of the two electrodes of the electronic element and the second electrode are connected with a metal wire, a third electrode and a fourth electrode to be electrically connected to the first and second electrodes respectively are formed on the other surface of the ceramic substrate, conductive relay members for electrically connecting the first electrode to the third electrode and the second electrode to the fourth electrode are formed between the one surface and the other surface of the ceramic substrate, at least a part of the peripheral portion of the ceramic substrate is positioned so as to extend both inside and outside a cavity of a mold for transfer molding, and resin for transfer molding is injected into the cavity. According to this example, resin packages of a plurality of electronic devices are formed uniformly on the ceramic substrate. In addition, the unevenness in thickness of the resin among the plurality of electronic devices formed on the ceramic substrate also is reduced. Therefore, after the molding, not only the after-processing such as grinding of the surface of the resin using a grinder or the like is no longer necessary but also the surface of the resin is allowed to adhere to a fixing tape easily, thus solving the problem that the electronic devices come off from the fixing tape and are lost in a dicing process. Furthermore, since this example enables the thickness of the resin to be uniform, electronic devices can be formed not only in the vicinity of the center of the ceramic substrate but also in the vicinity of the periphery of the ceramic substrate, thus increasing the number of electronic devices that can be formed on the ceramic substrate.

In an electronic device of yet another example according to the present invention, a ceramic substrate is positioned so as to extend both inside and outside a cavity of a mold for transfer molding, and a metallic thin film is present in a gap between the mold for transfer molding and at least a part, which is positioned outside the cavity, of the periphery of the ceramic substrate. According to this example, the metallic thin film serves as a buffer and thus the ceramic substrate is not damaged.

In another example of the present invention, a mold for transfer molding is formed of an upper mold and a lower mold, and a part, where the ceramic substrate is placed, of at least one of the upper and lower molds has a slide member that slides in a direction of pressing the ceramic substrate in its thickness direction. According to this example, slight tilt or distortion of the upper and lower molds heated to a high temperature can be compensated and the pressure applied to the ceramic substrate can be adjusted to be uniform, thus preventing cracks or breakage from occurring in the ceramic substrate.

According to still another example of the present invention, a resin film is allowed to adhere to a surface for molding resin of at least one of an upper mold and a lower mold. Preferably, this resin film is fluororesin and has a thickness of at least 50 $\mu$m. According to this example, a buffer effect of the resin film relieves a stress applied to the ceramic substrate in clamping by the mold, thus preventing cracks or breakage in the ceramic substrate. Further, the pressure for supplying resin into the mold can prevent thermosetting resin for transfer molding from entering under the ceramic substrate. In addition, the film is allowed to adhere to an inner face of a cavity, thus preventing the resin from sticking to the mold. This example can ensure the thickness that enables the pressure applied to the ceramic substrate to be buffered sufficiently. Therefore, the resin can be injected without breaking a portion of a film deformed and compressed by the mold pressure, the pressure for injecting the resin, or the like. In addition, the resin can be prevented from sticking to the mold. In order to spread the film inside the mold to cover the inner face of the cavity and to allow the film to adhere thereto and in order to relieve the stress applied to the ceramic substrate, it is possible to allow the film to have flexibility.

Another example of the present invention is directed to a method of manufacturing an electronic device in which a metallic thin film is formed at the same time at least one of an electrode formed on one side of a ceramic substrate and an electrode formed on the other side is formed. According to this configuration, the metallic thin film is preformed on the ceramic substrate at the same time at least any one of the first to fourth electrodes is formed. Therefore, a step for preparing the metallic thin film can be omitted.

Moreover, another example of the present invention is directed to an apparatus for manufacturing an electronic device that includes a ceramic substrate provided with electrodes, electronic elements, and metal wires and is formed by placing the ceramic substrate so as to extend both inside and outside a cavity of a mold for transfer molding and injecting resin for transfer molding into the cavity. In the apparatus, the mold for transfer molding is formed of an upper mold and a lower mold, and the pressure applied to at least one of the upper mold and the lower mold is allowed to vary corresponding to the pressure for injecting the resin for transfer molding. According to this example, the pressure applied between the upper mold and the lower mold is set to be slightly higher than the pressure for injecting the resin when the injection pressure is low and is set to enable the mold to resist the pressure for injecting the resin when the injection pressure is relatively high. Therefore, the state in which high pressure is applied to the ceramic substrate constantly can be relieved, thus preventing the ceramic substrate from breaking.

In another example of the present invention, pressure applied to at least one of an upper mold and a lower mold can be controlled in two stages. According to this example, it is possible to cope with two steps during and after resin injection. During the resin injection, a relatively low pressure is required for injecting the resin, and after the resin injection, a relatively high pressure is required to be applied to the resin.

Further, in another example of the present invention, at least one of the two stages of the pressure to be applied is employed in injecting resin for transfer molding into a cavity and the other is employed after the injection of the resin for transfer molding. According to this example, it is possible to cope with two steps: during the injection (filling) of the resin for transfer molding requiring relatively low pressure for injecting the resin; and after the resin injection requiring relatively high pressure applied to the resin to eliminate bubbles inside the cavity.

The present invention is described with reference to the drawings as follows.

First Embodiment

Figure 1:
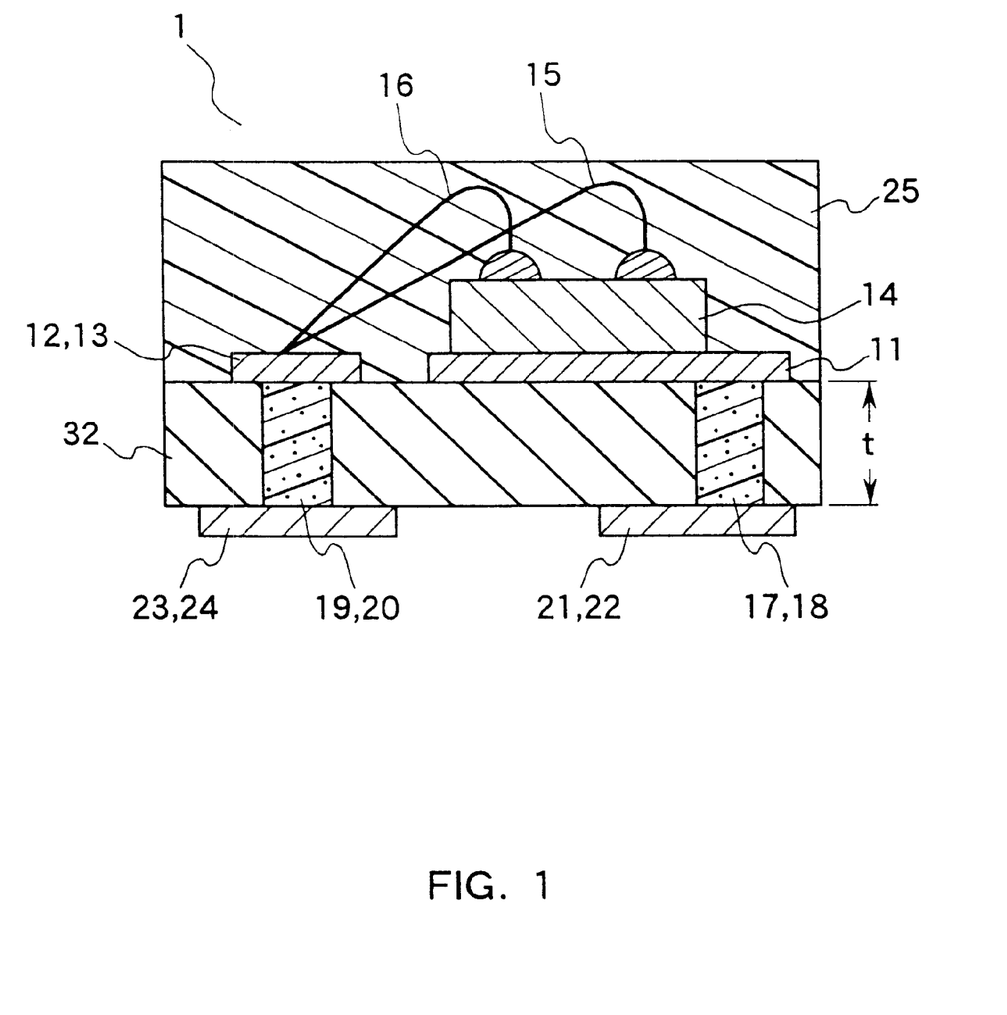
FIG. 1 is a sectional side view of an electronic device according to a first embodiment of the present invention.
Figure 3A:
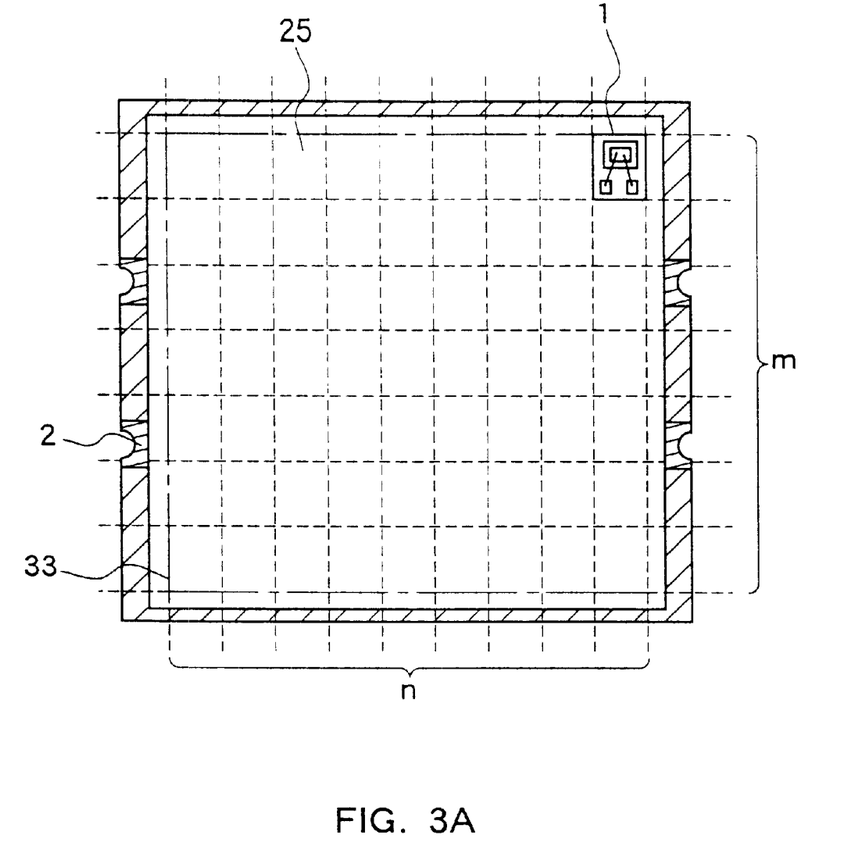
FIG. 3A is a plan view of a master electronic device in which a plurality of electronic devices according to the first and second embodiments of the present invention are formed.
Figure 3B:
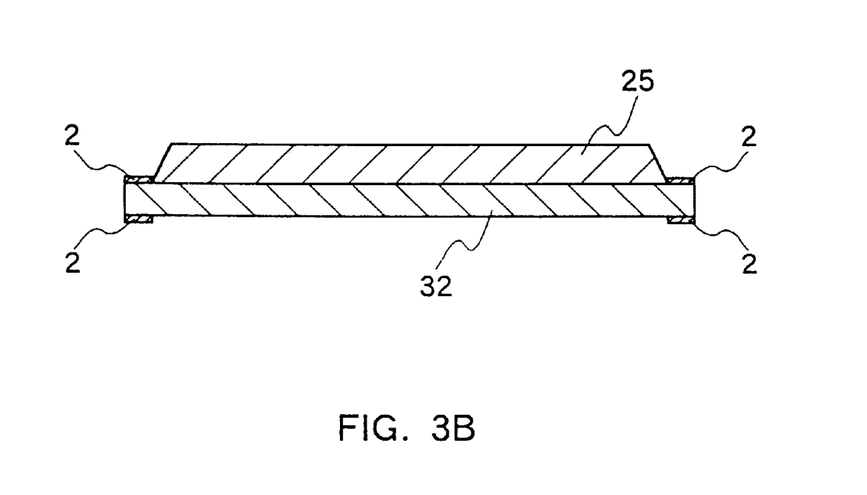
FIG. 3B is its sectional side view.

FIG. 1 shows a schematic configuration of an electronic device according to a first embodiment of the present invention, which is obtained by cutting a master electronic device shown in FIGS. 3A and 3B by dicing. Specifically, FIG. 1 shows a sectional side view of a three-terminal leadless small surface mount transistor provided with three electrodes including a collector electrode, a base electrode, and an emitter electrode.

As shown in the figure, an electronic device 1 according to the first embodiment of the present invention includes a ceramic substrate 32, upper electrodes 11 to 13, lower electrodes 21 to 24, via holes 17 to 20 provided in the ceramic substrate 32, and metal wires 15 and 16.

The thickness t of the ceramic substrate 32 was set to be 0.15 to 0.20 mm. The via holes 17 to 20 having a diameter of approximately 0.10 mm were provided in predetermined places of the ceramic substrate 32. Inside the via holes 17 to 20, for instance, a conductive paste was injected to form conductors. The conductors formed inside these via holes serve as conductive relay members for electrically connecting the upper electrodes 11 to 13 and the lower electrodes 21 to 24.

The first to third upper electrodes 11 to 13 and the lower electrodes 21 to 24 on the ceramic substrate 32 were gold-plated.

The collector electrode of the transistor 14 was die-bonded directly to the first upper electrode 11. The second upper electrode 12 and the third upper electrode 13, which were positioned so as to be separated from the first upper electrode 11, were electrically connected to the base electrode and the emitter electrode of the transistor 14 with the first metal wire 15 and the second metal wire 16, respectively.

Then, the transistor 14, the first metal wire 15, and the second metal wire 16 were coated with thermosetting resin 25 (for instance, epoxy resin using bisphenol A or cresol-novolac glycidyl ether resin as a base) for transfer molding that generally had been used conventionally. A coating method is described in detail in a third embodiment later. The coating thickness of the resin for transfer molding was set to be 0.35 to 0.39 mm. The electronic device 1 divided by dicing had a dimension of 1 mm (length)×0.8 mm (width)×0.6 mm (height).

In the above-mentioned embodiment, a transistor with three electrodes was illustrated. However, the present embodiment is not limited to this. Any electronic devices are acceptable as long as they are provided with at least two electrodes such as, for example, a diode, a resistor, or the like. In this case, an electronic device can have a configuration using smaller numbers of the upper electrodes 11 to 13, the lower electrodes 21 to 24, the via holes 17 to 20, and the metal wires 15 and 16.

Second Embodiment

Figure 2A:
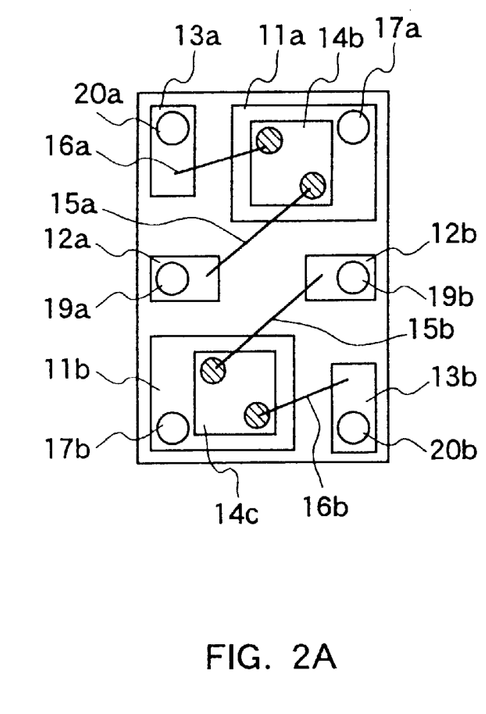
FIG. 2A is a plan view of an electronic device on which a plurality of electronic elements are mounted, according to a second embodiment of the present invention.
Figure 2B:
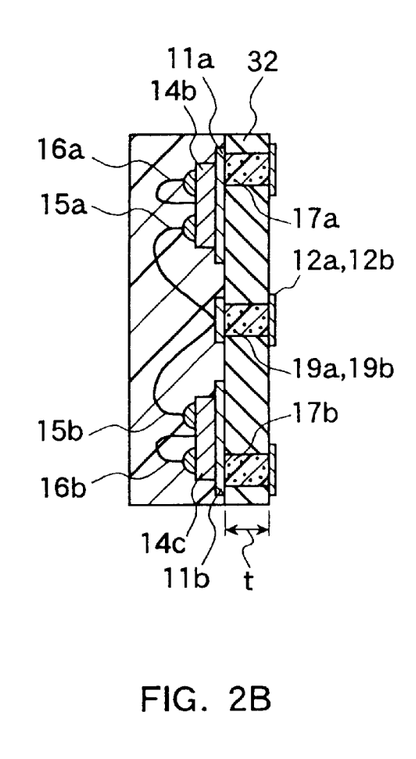
FIG. 2B is its sectional side view.
Figure 2C:
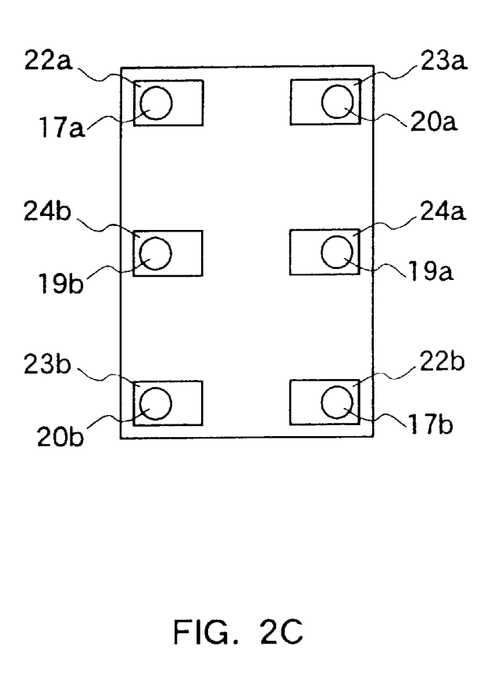
FIG. 2C is its bottom view.

FIGS. 2A, 2B, and 2C show a surface view, a sectional side view, and a bottom view of a six-terminal small surface mount electronic device in which electronic elements including two transistors 14b and 14c are mounted in one package. The electronic device is obtained by cutting a master electronic device shown in FIGS. 3A and 3B by dicing.

As in the first embodiment, the thickness t of a ceramic substrate 32 is selected to be in a range of 0.15 to 0.2 mm. In the ceramic substrate 32, six via holes 17a, 17b, 19a, 19b, 20a, and 20b having a diameter of approximately 0.1 mm are formed. Inside these via holes, for instance, a conductive paste is injected to form conductors.

On the ceramic substrate 32, first to sixth upper electrodes 11a, 11b, 12a, 12b, 13a and 13b, and lower electrodes 22a, 22b, 23a, 23b, 24a and 24b are formed by gold plating.

To the first upper electrode 11a, a collector electrode of the transistor 14b is die-bonded. To the second upper electrode 11b positioned so as to be separated from the first upper electrode 11a, a collector electrode of the transistor 14c is die-bonded. The third upper electrodes 12a and 12b, which are positioned between the first upper electrode 11a and the second upper electrode 11b, are electrically connected to, for example, emitter electrodes of the transistors 14b and 14c with metal wires 15a and 15b, respectively.

The fifth upper electrode 13a positioned so as to be separated from the first upper electrode 11a is electrically connected to, for example, a base electrode of the transistor 14b with a metal wire 16a. The sixth upper electrode 13b positioned so as to be separated from the second upper electrode 11b is electrically connected to, for example, a base electrode of the transistor 14c with a metal wire 16b.

The upper electrodes 11a, 11b, 12a, 12b, 13a, and 13b on an upper surface 321 of the ceramic substrate 32 are electrically connected to the lower electrodes 22a, 22b, 24a, 24b, 23a, and 23b on a lower surface 322 of the ceramic substrate 32 via the via holes 17a, 17b, 19a, 19b, 20a, and 20b, respectively. The lower electrodes are gold-plated.

The via holes 17a, 17b, and the like are conductive relay members for electrically connecting the upper electrodes and the lower electrodes formed on one surface and the other surface of the ceramic substrate.

The upper surface of the ceramic substrate 32, the first to sixth upper electrodes 11a, 11b, 12a, 12b, 13a, and 13b, the transistors 14b and 14c, and the metal wires 15a, 15b, 16a, and 16b were coated with thermosetting resin 25 for transfer molding.

The second embodiment was directed to a configuration with six terminals in which two transistors provided with three electrodes can be connected separately, but is not limited to this. For example, an integrated circuit unit such as a comparator, an operational amplifier, or the like is allowed to be built in and its predetermined electrodes such as an input terminal, an output terminal, a power terminal, or the like may be connected.

FIGS. 3A and 3B show a so-called master electronic device obtained before individual electronic devices of the present invention are formed. In this master electronic device, on one common ceramic substrate 32 on which wires and electrodes already have been formed, for example, m×n pieces of integrated circuit units shown in FIG. 1 or FIG. 2, or those not shown in the figures are arranged in a matrix form. This master electronic device is coated and sealed with the resin 25 for transfer molding. The master electronic device sealed with the resin is cut along cutting plane lines 33, thus forming individual electronic devices 1. In a portion at the periphery of the ceramic substrate 32, a metallic thin film 2 is formed, which is described later.

Third Embodiment

The following description is directed to an example of the method for manufacturing an electronic device of the present invention. Particularly, the present invention relates to a manufacturing method until the master electronic device shown in FIGS. 3A and 3B is completed.

Figure 4:
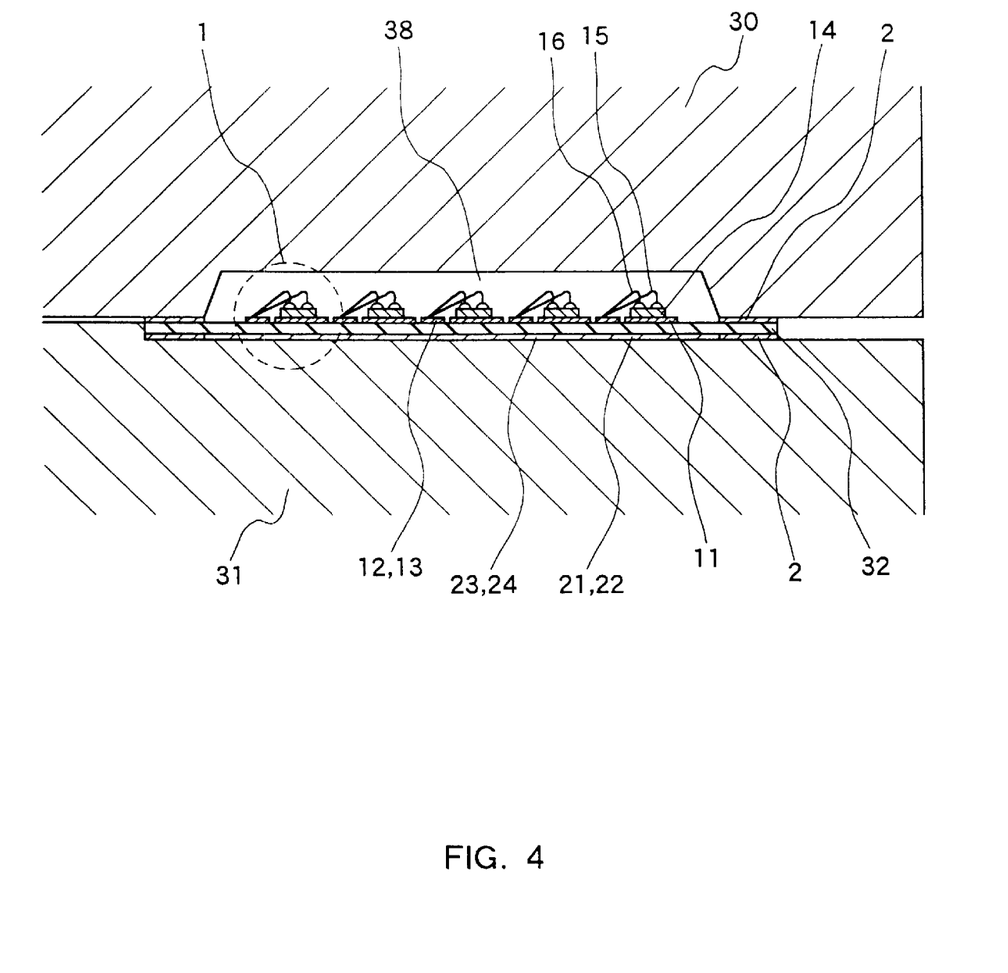
FIG. 4 is a sectional view showing a manufacturing method using a mold for transfer molding according to a third embodiment of the present invention.

As shown in FIG. 4, a ceramic substrate 32 is sandwiched between an upper mold 30 and a lower mold 31 of a mold for transfer molding. On the ceramic substrate 32, upper electrodes 11 to 13 and lower electrodes 21 to 24 already have been formed. In addition, predetermined electrodes of a transistor 14 and the upper electrodes already have been connected electrically through wires 15 and 16.

Furthermore, via holes for electrically connecting the upper electrodes 11 to 13 and the lower electrodes 21 to 24 also have been formed, which are not shown in FIG. 4.

The ceramic substrate 32 is positioned so as to extend both inside and outside a cavity 38 provided on the upper mold 30 side. In other words, the peripheral portion of the ceramic substrate 32 is allowed to extend outwards from the cavity and the portion extended outwards is positioned so as to come into contact with both the upper mold 30 and the lower mold 31.

In the portion that comes into contact with the upper and lower molds 30 and 31, a metallic thin film 2 was formed. The metallic thin film 2 functions as a buffer when the ceramic substrate 32 is sandwiched and compressed between the upper and lower molds 30 and 31.

As shown in FIG. 3A, the metallic thin film 2 was formed in the peripheral portion of the ceramic substrate 32 by being sintered at the same time the upper electrodes and the lower electrodes were printed to be formed with a conductive paste material. The material of the metallic thin film was tungsten and its thickness and width were set to be 20 $\mu$m and 1.0 mm.

The metallic thin film 2 functioning as a buffer may be formed only on one of the upper surface and the lower surface of the ceramic substrate 32. As the metallic thin film 2, the upper electrodes 11 to 13 also can be used. That is to say, the metallic thin film includes one utilizing electrodes. There is a difference in thickness among the upper electrodes 11 to 13, but the difference in thickness is approximately equivalent to an air vent used in the mold. Therefore, the thicknesses of the electrodes provide the same function as that of the air vent, thus enabling molding. The region indicated by a broken-line circle in FIG. 4 indicates the electronic device 1 shown in FIG. 1.

As described above, the upper mold 30 and the lower mold 31 were allowed to maintain the ceramic substrate 32 in parallel thereto, and the ceramic substrate 32 was pressurized with a predetermined pressure. After that, molten thermosetting resin 25 for transfer molding was allowed to flow into the cavity 38 via a runner 35 by a plunger 36. Thus, the ceramic substrate 32 was coated with the resin 25 for transfer molding (FIG. 5).

The transfer molding was carried out at a temperature of 175° C. with a molding pressure of 15 kg/cm² for a curing time of 90 sec.

Figure 5:
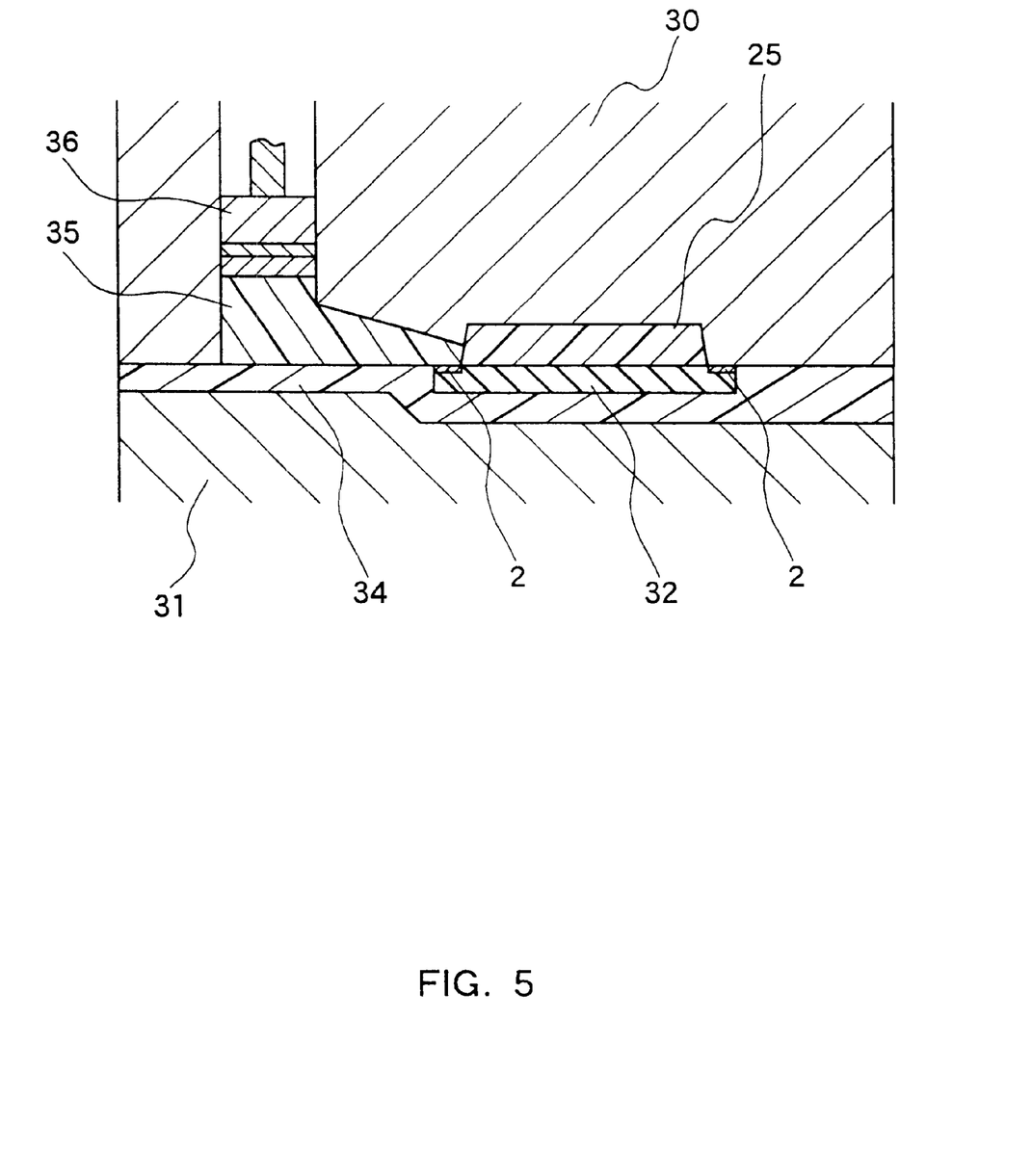
FIG. 5 is a schematic sectional view of a mold for transfer molding using a resin film, which shows a further example according to the third embodiment of the present invention.

FIG. 5 shows another example of the present invention in which a resin film 34 is allowed to adhere to an inner face of the lower mold 31 of the mold for transfer molding.

In FIG. 5, the resin film 34 is allowed to adhere uniformly to the upper face of the lower mold 31 by, for example, an evacuation method. As this resin film, a polytetrafluoroethylene resin film having a thickness of about 100 μm was used. However, when the film has a thickness of at least 50 μm, a sufficient buffer effect can be obtained.

In FIG. 5, the resin film 34 was allowed to adhere to the inner face of the lower mold 31, but the mold to which the resin film 34 adheres is not limited to the lower mold. The resin film 34 may be allowed to adhere to the upper mold or to the entire inner surfaces of the upper and lower molds. When a film of fluororesin such as, for example, polytetrafluoroethylene or the like is employed as the resin film 34, it is effective in terms of flexibility and heat resistance.

In the present embodiment, a three terminal transistor was used. However, the present embodiment also can be applied to electronic devices other than that with three terminals.

Figure 6:
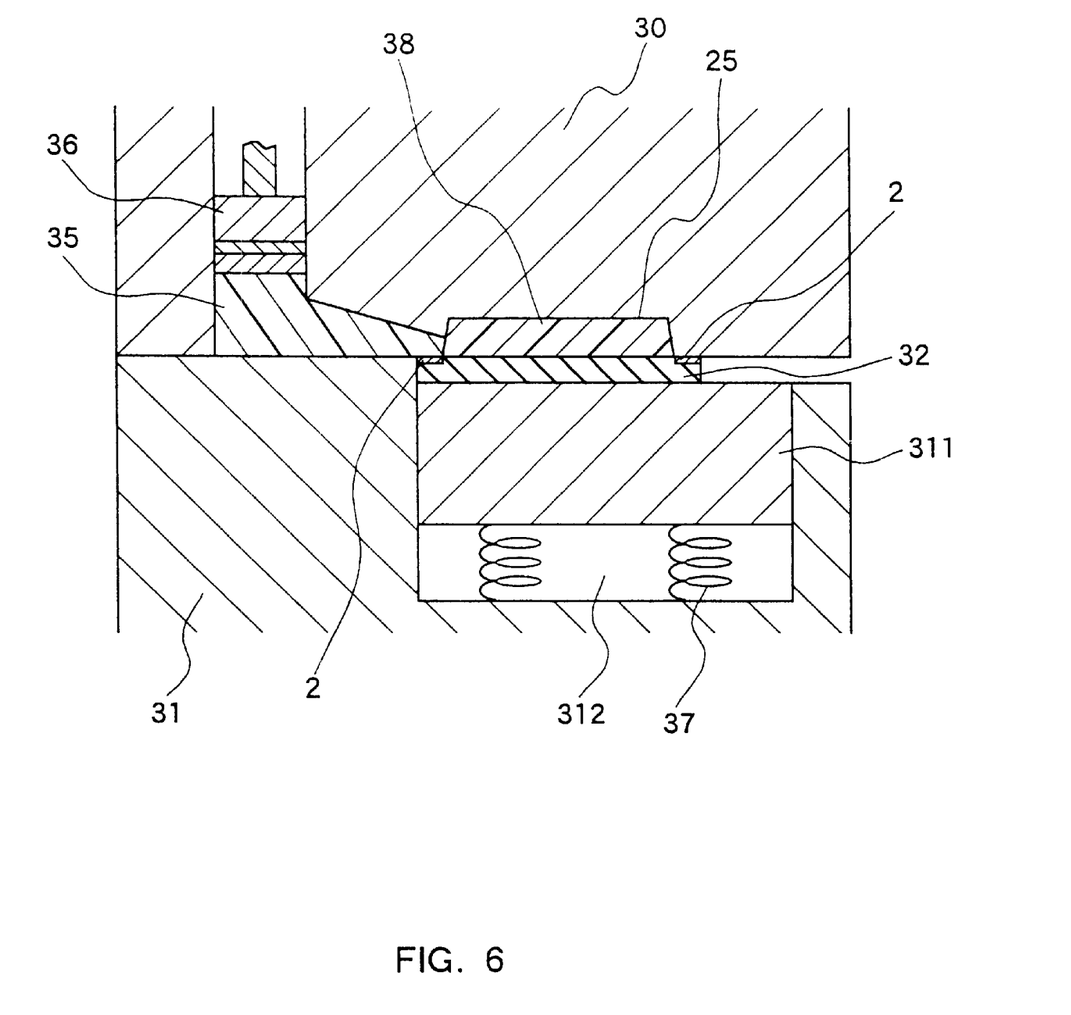
FIG. 6 is a schematic sectional view of a mold for transfer molding having a slide member in a lower mold, which shows another example according to the third embodiment of the present invention.

FIG. 6 shows another example of the present invention in which a slide member is provided in the lower mold 31 of the mold for transfer molding.

In FIG. 6, a slide member 311 capable of pressing the ceramic substrate 32 in its thickness direction is provided at least in a portion, where the ceramic substrate 32 is placed, of the lower mold 31 receiving the ceramic substrate 32. This slide member 311 is supported by the lower mold 31 via, for example, a coiled spring 37 in a predetermined space 312 provided in the lower mold 31.

The slide member 311 is operated so that pressure is applied to the ceramic substrate 32 in its thickness direction. In this case, the slide member 311 was provided on the lower mold 31 side. However, the slide member 311 may be provided on the upper mold side.

Fourth Embodiment

Figure 7A:
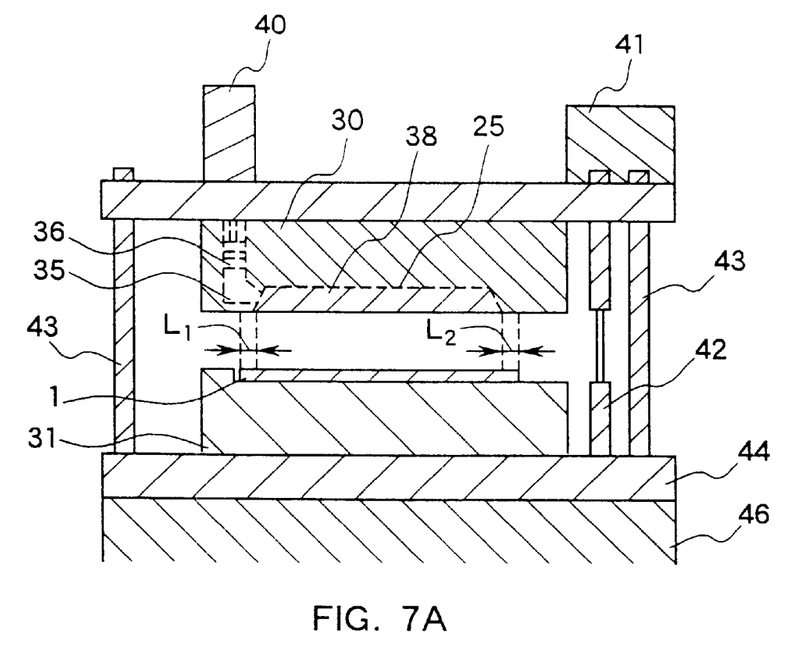
FIG. 7A shows a fourth embodiment of the present invention and is a view illustrating a state in which an upper mold and a lower mold of a mold for transfer molding are positioned apart.
Figure 7B:
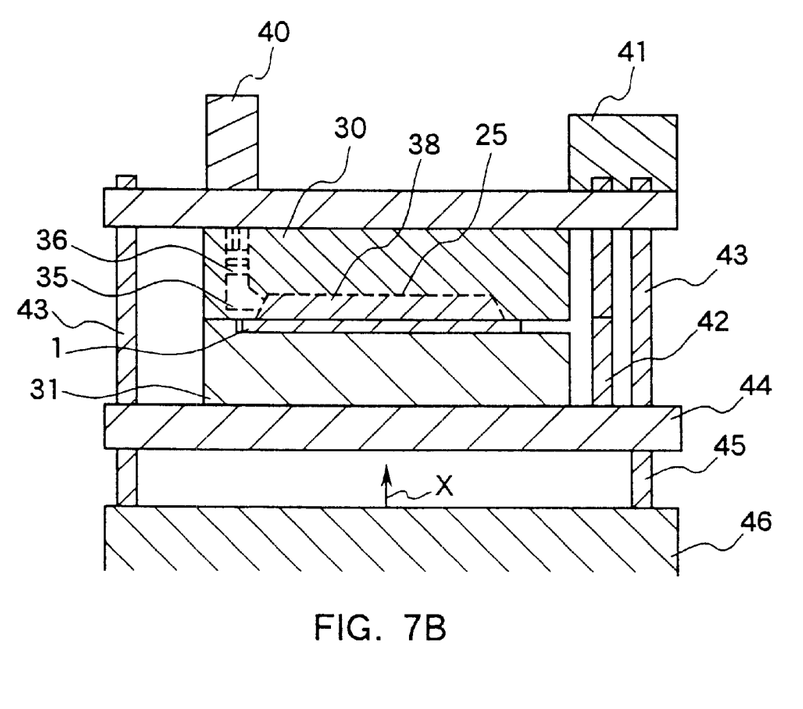
FIG. 7B is a view illustrating a state in which the upper mold and the lower mold of the mold for transfer molding are in contact and a pressure is applied to electronic devices.

FIGS. 7A and 7B show a manufacturing apparatus with a mold for transfer molding according to the present invention. The present embodiment is different from the third embodiment in that the pressure applied between an upper mold 30 and a lower mold 31 varies corresponding to pressure for injecting resin for transfer molding, i.e. the motion of a plunger 36 shown in FIGS. 5 and 6.

The upper mold 30 and the lower mold 31 are supported by a stopper 42 for stroke adjustment and columns 43. On the upper mold 30 side, a runner 35 used in injecting thermosetting resin 25 for transfer molding into a cavity 38, the plunger 36 for delivering the thermosetting resin 25 into the cavity 38, and a plunger pot 40 for storing the thermosetting resin 25 are provided. In addition, a servo motor 41 is provided on the upper mold 30 side.

The servo motor 41, which is not shown in detail in the figures, is equipped so as to operate at least one of the upper mold 30 and the lower mold 31 corresponding to the motion of the plunger 36.

The thermosetting resin 25 for transfer molding melted inside the plunger pot 40 flows through the runner 35 by the plunger 36, thus filling the cavity 38. Inside the cavity 38, electronic devices 1 to be sealed with the thermosetting resin 25 have been placed in advance.

In FIG. 7A, details of the electronic devices 1 are not shown. However, before being coated with the thermosetting resin 25, the electronic devices 1 are in a state similar to that shown in FIG. 4 used for explaining the third embodiment. After being coated with the thermosetting resin 25, the electronic devices 1 are in approximately the same state as that shown in FIG. 3 used for explaining the third embodiment.

The peripheral portion of the electronic devices 1 is positioned so as to extend outwards from the ends of the cavity 38 for L1 and L2. In other words, the electronic devices 1 are positioned so as to extend both inside and outside the cavity 38. The peripheral portion of the electronic devices 1 extending for L1 and L2 comes into contact with both the upper mold 30 and the lower mold 31 and are sandwiched between them. Therefore, when for example, the ceramic substrate of the electronic devices 1 is sandwiched between the upper and lower molds 30 and 31, the peripheral portion of the electronic devices 1 are subjected to pressure (indicated by an arrow X in FIG. 7B) from both the molds 30 and 31. When this pressure exceeds the critical pressure for the ceramic substrate of the electronic devices 1, the electronic devices 1 are deformed or broken.

Generally, the inlet velocity of the resin varies depending on a resin material, a volume of the cavity, or the like. However, once the resin material and the volume of the cavity are determined, an approximately constant inlet velocity of the resin can be obtained. Thus, the time required for the transfer molding step can be determined.

Figure 8:
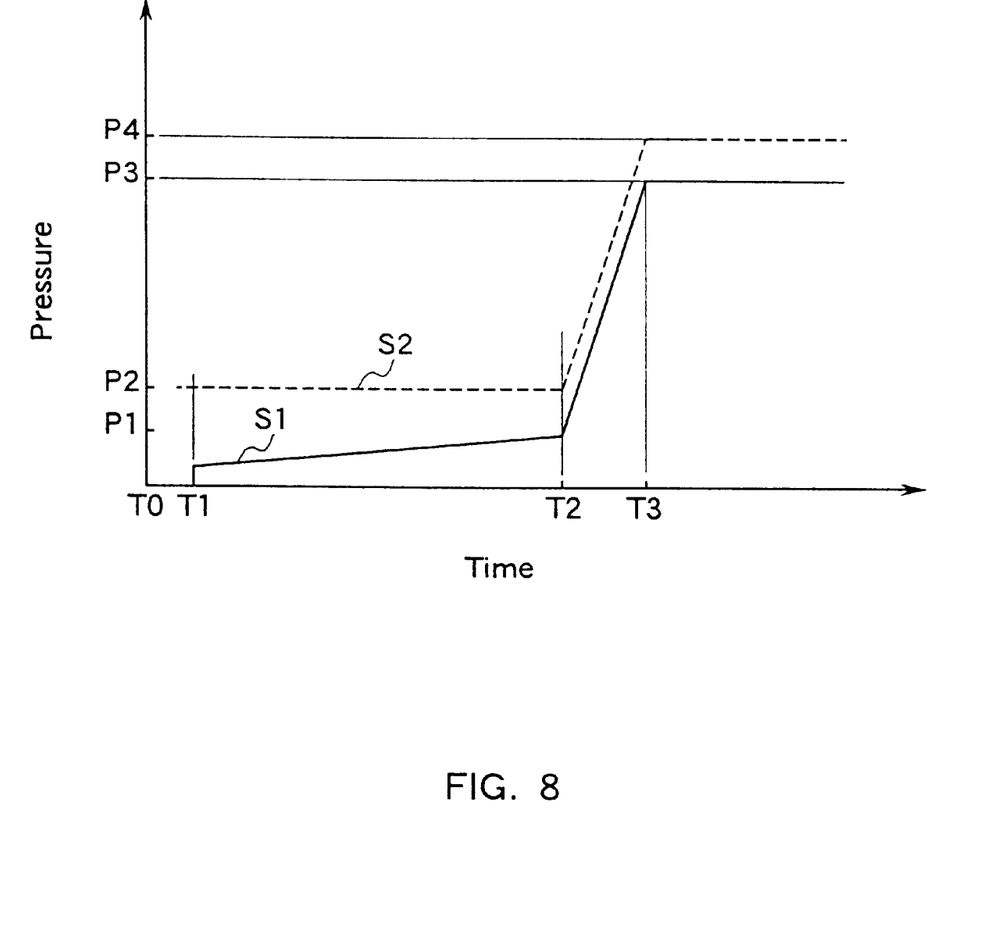
FIG. 8 is a graph showing the relationship between time and molding pressure in transfer molding carried out according to the fourth embodiment of the present invention.

FIG. 8 shows a molding pattern in a transfer molding method of the present invention. The horizontal axis indicates time and the vertical axis indicates pressure. A solid line S1 indicates pressure when the plunger 36 delivers the thermosetting resin 25 into the cavity 38. A broken line S2 indicates pressure applied between the upper mold 30 and the lower mold 31. In order to carry out the transfer molding normally, the pressure indicated by the broken line S2 applied between the molds 30 and 31 is set and maintained so as to be higher than the delivery pressure of the plunger 36, which is indicated by the solid line Si, constantly, i.e. so as to have the relationship of S2>S1.

The solid line S1 shows that injection of the thermosetting resin 25 for transfer molding is started at the time T1, the filling of the resin is completed and simultaneously the pressurization of the resin is started at the time T2, and pressurization packing is completed at the time T3. The time (T2−T1) for filling the resin is a few seconds, and the pressure P1 when the filling is completed is a few kilogram-weight. Furthermore, immediately after the completion of the injection (filling) of the resin (T2), in order to remove bubbles inside the cavity 38, a further pressure of a few hundreds kilogram-weight is applied to pressurize the resin (to carry out the pressurization packing). The time (T3−T2) for the pressurization packing for removing bubbles is set to be one second or shorter.

The time (T3−T2) for pressurizing the resin is set to be one second or shorter and the pressure P3 when the pressurization packing of the resin is completed is 150 to 300 kilogram-weight.

On the other hand, as shown with the broken line S2, a slightly higher pressure P2 than the pressure P1 for injecting the resin is applied between the upper mold 30 and the lower mold 31 at a time (T0) prior to the time T1 when the injection of the resin is started and is set so that the molds 30 and 31 can resist the pressure P1. The pressure for injecting the resin corresponds to the delivery pressure of the plunger 36. In addition, a slightly higher pressure P4 than the pressure P3 required for pressurizing the resin is applied between the upper mold 30 and the lower mold 31 at the same time the pressurization of the resin is started (T2).

In this case, the pressure P4 is 200 to 400 kilogram-weight and is set to maintain the relationship of P4>P3, thus excluding the state in which excessive pressure is applied between the molds 30 and 31 constantly. In other words, conventionally, the pressure applied between the upper and lower molds 30 and 31 must be fixed to the highest pressure P4 constantly. In the present invention, however, the pressure can be varied corresponding to the pressure for injecting the resin for transfer molding, i.e. the delivery pressure of the plunger 36. That is to say, the pressure applied between the upper and lower molds 30 and 31 is controlled in the two stages of P2 and P4 Of course, the control in three stages or more also is possible.

By such control and change of the pressures, excessive pressure applied to the ceramic substrate sandwiched between the molds 30 and 31 can be reduced, thus preventing the ceramic substrate from being deformed or broken.

The variability of the pressure applied between the upper mold 30 and the lower mold 31 is controlled by a member for varying pressure to be applied. A main component of the member for varying pressure to be applied is a servo motor 41. This servo motor 41 operates the lower mold 31 together with a lower plate 44 to which the lower mold 31 is attached, vertically as shown by the arrow A and operates so that the peripheral portion of the electronic devices 1 comes into contact with the upper mold 31. Numeral 45 indicates a plate guide for guiding a lower plate 44, and numeral 46 a base for supporting the upper mold 30 and the lower mold 31.

The time (T2−T1) for filling the resin is allowed to be approximately constant as described above. Therefore, by measuring this time and setting, for example, a timer or the like, the servo motor 41 is controlled and the pressure applied between the molds 30 and 31 for transfer molding can be varied in two stages from the primary pressure (P2) in filling the resin to the secondary pressure (P4) in pressurization packing.

In other words, since the pressure applied between the molds 30 and 31 is allowed to correspond to the pressure for injecting the resin for transfer molding or the motion of the plunger 36, it is not always necessary to detect the pressure for injecting the resin or the motion directly. Thus, the manufacturing apparatus can be simplified by controlling the servo motor 41 using a timer as described above.

In the fourth embodiment of the present invention, as described in the third embodiment and as shown in FIG. 4, a metallic thin film 2 may be provided in a portion with which the upper mold 30 and the lower mold 31 come into contact, thus providing a function of a buffer. In addition, as shown in FIG. 5, a resin film 34 may be allowed to adhere to a surface for molding the resin of at least one of the upper mold 30 and the lower mold 31. Moreover, as shown in FIG. 6, a slide member 311 may be employed. Of course, they may be combined.

In the present embodiment, the explanation was given using a three terminal transistor. However, the present embodiment also can be applied to electronic devices other than that having three terminals.

As described above, according to the present invention, the ceramic substrate provided with the metallic thin film integrated into at least one selected from the upper surface and the lower surface of the ceramic substrate in its peripheral portion is placed so as to extend both inside and outside the cavity of the mold for transfer molding and the metallic thin film is positioned in a portion with which the upper mold and the lower mold of the mold come into contact. Therefore, even when the ceramic substrate is sandwiched and compressed between the upper and lower molds, the pressure applied to the ceramic substrate is buffered. Consequently, no distortion force is caused, thus avoiding cracks or breakage in the ceramic substrate.

According to an electronic device of the present invention, the adhesion between a ceramic substrate and resin in reflow in mounting a printed circuit board is improved and the strength of the resin also increases. Furthermore, the use of a ceramic substrate with a thickness of 0.2 mm or less enables via holes with a diameter of 0.1 mm to be formed, thus reducing the weight of the electronic device. Moreover, a suitable design of the configuration of the mold for transfer molding enables the electronic device to be coated with thermosetting resin for transfer molding.

Further, according to the method of manufacturing an electronic device of the present invention, even when the ceramic substrate has a thickness of 0.2 mm or less, resin molding by a transfer molding method is possible and the molding formation can be carried out within a certain curing time. Consequently, there is no difficulty in handling the resin, it is not necessary to take measures for eliminating floating dusts until the resin is cured, leaving the resin on a flat plate, or the like, and a long time for curing the resin also is not required, as in the case of using liquid resin, thus shortening the process.

In the case of using liquid resin, the accuracy among elements must be secured by grinding a surface molded with resin in order to obtain a uniform thickness of the resin, and the number of electronic devices that can be formed on a ceramic substrate was limited. In dicing, due to the irregularity in the resin surface, it was difficult to allow the resin surface to adhere to a fixing sheet. However, the formation using a mold for transfer molding enables such a problem to be solved and the process to be shortened, and prevents electronic devices from being lost.

Furthermore, according to the method of manufacturing an electronic device of the present invention and the apparatus for manufacturing the same, the pressure applied between the upper mold and the lower mold can be varied corresponding to the pressure of the plunger, thus relieving excessive pressure applied to the substrate of the electronic devices sandwiched between the upper mold and the lower mold. Thus, the deformation or cracks in the substrate of ceramic or the like can be prevented.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing an electronic device, comprising mounting plural sets of electronic components on a ceramic substrate and sealing and molding the electronic components with thermosetting resin by transfer molding, wherein the ceramic substrate is provided with a metallic thin film integrated into at least one selected from an upper surface and a lower surface of the ceramic substrate in its peripheral portion, the ceramic substrate is placed so as to extend both inside and outside a cavity of a mold for transfer molding, and the metallic thin film is positioned on a portion with which an upper mold and a lower mold of the mold come into contact;

the thermosetting resin for transfer molding is injected into the cavity, is molded, and is cured by heating; and the metallic thin film has a thickness in a range of 10 to 50 $\mu$m and a width in a range of 1.0 to 2.5 mm.

2. The method of manufacturing an electronic device according to claim 1, wherein the metallic thin film is present on each of the upper surface and the lower surface of the ceramic substrate.

3. The method of manufacturing an electronic device according to claim 1, wherein the metallic thin film is formed by printing a metal paste on a green sheet of a material of the ceramic substrate and sintering it so as to integrate it into the ceramic substrate when the green sheet is sintered.

4. The method of manufacturing an electronic device according to claim 1, wherein the metallic thin film is tungsten.

5. The method of manufacturing an electronic device according to claim 1, wherein the thermosetting resin is epoxy resin.

6. The method of manufacturing an electronic device according to claim 1, wherein conditions in molding the electronic components include a temperature in a range between 140 and 190° C., a molding pressure of 10 to 50 kg/cm$^2$, and a curing time of 60 to 100 sec.

7. The method of manufacturing an electronic device according to claim 1, wherein a slide member is further provided in a portion, where the ceramic substrate is placed, of at least one of the upper mold and the lower mold, and the slide member is positioned so as to press the ceramic substrate in its thickness direction.

8. The method of manufacturing an electronic device according to claim 1, wherein a resin film is allowed to adhere to a surface for molding the resin of at least one of the upper mold and the lower mold.

9. The method of manufacturing an electronic device according to claim 1, wherein the metallic thin film is formed integrally at the same time an electrode on at least one surface of the ceramic substrate is sintered.

10. The method of manufacturing an electronic device according to claim 1, wherein pressure applied to at least one of the upper mold and the lower mold is varied corresponding to pressure for injecting the thermosetting resin for transfer molding.

11. The method of manufacturing an electronic device according to claim 10, wherein the pressure applied to at least one of the upper mold and the lower mold is controlled in two stages.

12. The method of manufacturing an electronic device according to claim 11, wherein at least one of the two stages is used when the resin for transfer molding is injected into the cavity, and the other of the two stages is used after injection of the resin for transfer molding is completed.

13. A method of manufacturing an electronic device, wherein a master electronic device obtained by the method according to claim 1 is divided into individual electronic devices by dicing.

14. An apparatus for manufacturing an electronic device, comprising:

a plunger for pressurizing thermosetting resin for transfer molding;

a runner in which the thermosetting resin for transfer molding flows;

a cavity into which the thermosetting resin for transfer molding flows, which communicates with the runner; and a mold for transfer molding including an upper mold and a lower mold that define the cavity, wherein a ceramic substrate provided with a metallic thin film integrated into at least one selected from an upper surface and a lower surface of the ceramic substrate in its peripheral portion is placed so as to extend both inside and outside the cavity of the mold for transfer molding, and the metallic thin film is positioned in a portion with which the upper mold and the lower mold of the mold come into contact; and the thermosetting resin for transfer molding is injected into the cavity, is molded, and is cured by heating.

15. The apparatus for manufacturing an electronic device according to claim 14, wherein the apparatus further comprises a member for varying pressure to be applied, the member varies pressure applied between the upper mold and the lower mold, and the member for varying pressure to be applied is operated corresponding to pressurization by the plunger.

16. The method of manufacturing according to claim 14, wherein the metallic thin film has a thickness in a range of 10 to 50 $\mu$m and a width in a range of 1.0 to 2.5 mm.

* * * * *